(12) United States Patent
Zhu et al.

(10) Patent No.: US 12,557,262 B2
(45) Date of Patent: Feb. 17, 2026

(54) METHOD OF MANUFACTURING SEMICONDUCTOR STRUCTURE AND SEMICONDUCTOR STRUCTURE

(71) Applicants: CHANGXIN MEMORY TECHNOLOGIES, INC., Hefei (CN); CHANGXIN JIDIAN (BEIJING) MEMORY TECHNOLOGIES CO., LTD., Beijing (CN)

(72) Inventors: Changli Zhu, Hefei (CN); Jinguo Fang, Hefei (CN); Jiawei Zhang, Hefei (CN)

(73) Assignees: CHANGXIN MEMORY TECHNOLOGIES, INC., Hefei (CN); CHANGXIN JIDIAN (BEIJING) MEMORY TECHNOLOGIES CO., LTD., Beijing (CN)

( * ) Notice: Subject to any disclaimer, the term of this patent is extended or adjusted under 35 U.S.C. 154(b) by 484 days.

(21) Appl. No.: 18/149,236

(22) Filed: Jan. 3, 2023

(65) Prior Publication Data

US 2023/0354575 A1 Nov. 2, 2023

(30) Foreign Application Priority Data

Apr. 29, 2022 (CN) .......................... 202210462552.9

(51) Int. Cl.
*H10B 12/00* (2023.01)
(52) U.S. Cl.
CPC ......... *H10B 12/033* (2023.02); *H10B 12/315* (2023.02)
(58) Field of Classification Search
CPC .... H10B 12/033; H10B 12/09; H10B 12/315; H10D 1/042; H10D 1/716
See application file for complete search history.

(56) References Cited

U.S. PATENT DOCUMENTS

| 2013/0228837 | A1* | 9/2013 | Sukekawa ............ H10B 12/033 257/532 |
| 2019/0189619 | A1 | 6/2019 | Pak et al. |

(Continued)

FOREIGN PATENT DOCUMENTS

| CN | 108447864 A | 8/2018 |
| CN | 110970402 A | 4/2020 |

(Continued)

OTHER PUBLICATIONS

First Office Action cited in CN202210462552.9, mailed Jun. 28, 2022, 11 pages.

(Continued)

*Primary Examiner* — Edward Chin
(74) *Attorney, Agent, or Firm* — Kilpatrick Townsend & Stockton LLP

(57) ABSTRACT

The present disclosure provides a method of manufacturing a semiconductor structure and a semiconductor structure. The method of manufacturing the semiconductor structure includes: providing a base, where contact structures arranged at intervals are formed on a surface of the base; forming, on the base, a stacked structure including alternately stacked a support layer and a sacrificial layer, where the stacked structure covers the contact structure; forming an isolation structure in the stacked structure, where the isolation structure runs through the sacrificial layer and part of the support layer along a direction perpendicular to the base, and is connected to the base through part of a remaining support layer, to divide the base into a first region and a second region; and forming a capacitor structure in the second region, where the capacitor structure is correspondingly connected to the contact structure in the second region.

14 Claims, 10 Drawing Sheets

(56) References Cited

U.S. PATENT DOCUMENTS

| | | | |
|---|---|---|---|
| 2019/0206724 A1* | 7/2019 | Chang | H01L 21/76834 |
| 2021/0375877 A1* | 12/2021 | Kim | H10B 12/315 |
| 2022/0052086 A1* | 2/2022 | Choi | H10F 39/811 |
| 2023/0030176 A1* | 2/2023 | Lee | H10B 12/09 |
| 2023/0034701 A1* | 2/2023 | Lee | H10B 12/315 |
| 2023/0035660 A1* | 2/2023 | Lee | H10D 64/27 |
| 2023/0039823 A1* | 2/2023 | Jeong | H10B 12/315 |

FOREIGN PATENT DOCUMENTS

| | | |
|---|---|---|
| CN | 110970403 A | 4/2020 |
| CN | 113161356 A | 7/2021 |
| WO | 2021179926 A1 | 9/2021 |

OTHER PUBLICATIONS

Second Office Action cited in CN202210462552.9, mailed Jul. 21, 2022, 9 pages.

\* cited by examiner

METHOD OF MANUFACTURING SEMICONDUCTOR STRUCTURE AND SEMICONDUCTOR STRUCTURE

CROSS-REFERENCE TO RELATED APPLICATION

This application claims the priority of Chinese Patent Application No. 202210462552.9, submitted to the Chinese Intellectual Property Office on Apr. 29, 2022, the disclosure of which is incorporated herein in its entirety by reference.

TECHNICAL FIELD

The present disclosure relates to the technical field of semiconductors, and in particular, to a method of manufacturing a semiconductor structure and a semiconductor structure.

BACKGROUND

Dynamic random access memories (DRAMs) are commonly-used semiconductor memory devices in computers, and have advantages of a small size, a high degree of integration, and low power consumption. The DRAM includes many repeated memory cells. Each memory cell usually includes a capacitor and a transistor, and as the semiconductor industry continues to evolve, a requirement on the performance of a capacitor in a semiconductor structure is increasingly high, for example, how to form a capacitor with a larger capacitance in a limited area.

However, as the capacitance of the capacitor increases, more support layers are required to ensure the stability of the capacitor, but more support layers increase the difficulty of manufacturing the capacitor and reduce the stability of a filling material near an edge position of an array region. Consequently, a crack is easily formed at a boundary of the capacitor array during subsequent deposition of the filling material, resulting in a short circuit between a plug and the boundary of the capacitor array. Therefore, the boundary of the capacitor array needs to be protected.

SUMMARY

An overview of the subject matter detailed in the present disclosure is provided below, which is not intended to limit the protection scope of the claims.

The present disclosure provides a method of manufacturing a semiconductor structure and a semiconductor structure.

A first aspect of the present disclosure provides a method of manufacturing a semiconductor structure. The method of manufacturing the semiconductor structure includes:
  providing a base, where spaced contact structures are formed on a surface of the base;
  forming, on the base, a stacked structure including alternately stacked a support layer and a sacrificial layer, where the stacked structure covers the contact structures;
  forming an isolation structure in the stacked structure, where the isolation structure runs through the sacrificial layer and part of the support layer along a direction is perpendicular to the base, and is connected to the base through part of a remaining support layer, to divide the base into a first region and a second region; and
  forming a capacitor structure in the second region, where the capacitor structure is correspondingly connected to the contact structures in the second region.

A second aspect of the present disclosure provides a semiconductor structure, including:
  a base, where spaced contact structures are provided on a surface of the base;
  a support structure, where the support structure is provided on the base, and the support structure includes a plurality of spaced support layers;
  an isolation structure, where the isolation structure is provided along a direction perpendicular to the base, and is connected to the base through part of the support layer, to divide the base into a first region and a second region; and
  capacitor structures, where the capacitor structures are arranged at intervals spaced in the support structure of the second region, and are correspondingly connected to the contact structures in the second region.

Other aspects of the present disclosure are understandable upon reading and understanding of the accompanying drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

Figure 1:
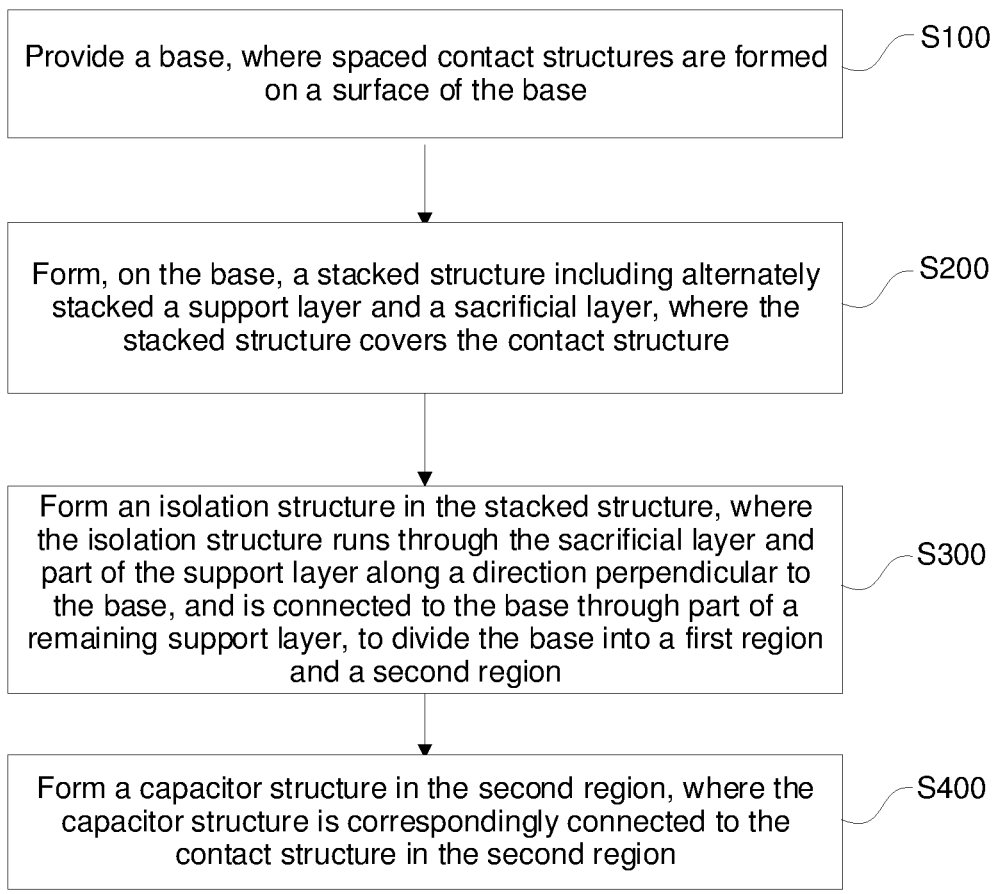
FIG. 1 is a flowchart of a method of manufacturing a semiconductor structure according to an exemplary embodiment.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Dynamic random access memories (DRAMs) are commonly-used semiconductor memory devices in computers, and have advantages of a small size, a high degree of integration, and low power consumption. The DRAM includes many repeated memory cells. Each memory cell usually includes a capacitor and a transistor, and as the semiconductor industry continues to evolve, a requirement on the performance of a capacitor in a semiconductor structure is increasingly high, for example, how to form a capacitor with a larger capacitance in a limited area.

However, as the capacitance of the capacitor increases, more support layers, such as three support layers, are required to ensure the stability of the capacitor. However, more support layers allow a specific recessed structure to be formed at an edge of an array region of the capacitor, where one side of the recessed structure may be used to form a contact plug and the other side of the recessed structure may be used to form a is capacitor structure. In this case, when a filling material is deposited in a region in which the contact plug is formed or when a filling material is processed (such as chemical mechanical polishing), a crack may be formed in the filling material. The crack may cause a short circuit between adjacent contact plugs or a short circuit between the contact plug and a boundary of the array region. Consequently, electrical properties and yields of semiconductor structures are reduced.

To resolve one of the technical problems, the present disclosure provides a method of manufacturing a semiconductor structure and a semiconductor structure. An isolation structure is formed in a support structure and a first region and a second region are defined through the isolation structure to enable the second region to obtain a flat boundary, so as to increase a density of a filling material (such as a second dielectric layer and a contact plug) in the first region in a filling process, and prevent a crack from being formed inside the filling material when the filling material is formed or the filling material is processed (such as chemical mechanical polishing), such that a short-circuit problem in the first region is effectively avoided, thereby improving the electrical properties and the yields of the semiconductor structures.

According to an exemplary embodiment, this embodiment provides a method of manufacturing a semiconductor structure. The method of manufacturing a semiconductor structure is described below with reference to FIG. 1 to FIG. 18.

The semiconductor structure is not limited in this embodiment. That the semiconductor structure is a transistor of a core region in a DRAM is used as an example below for description, but this embodiment is not limited thereto. Alternatively, the semiconductor structure in this embodiment may be other structures.

As shown in FIG. 1, an exemplary embodiment of the present disclosure provides a method of manufacturing a semiconductor structure, including the following steps:

Step S100: Provide a base, where spaced contact structures are formed on a surface of the base.

Step S200: Form, on the base, a stacked structure including alternately stacked a support layer and a sacrificial layer, where the stacked structure covers the contact structure.

Step S300: Form an isolation structure in the stacked structure, where the isolation structure runs through the sacrificial layer and part of the support layer along a direction perpendicular to the base, and is connected to the base through part of a remaining support layer, to divide the base into a first region and a second region.

Step S400: Form capacitor structures in the second region, where the capacitor structure is correspondingly connected to the contact structure in the second region.

Figure 2:
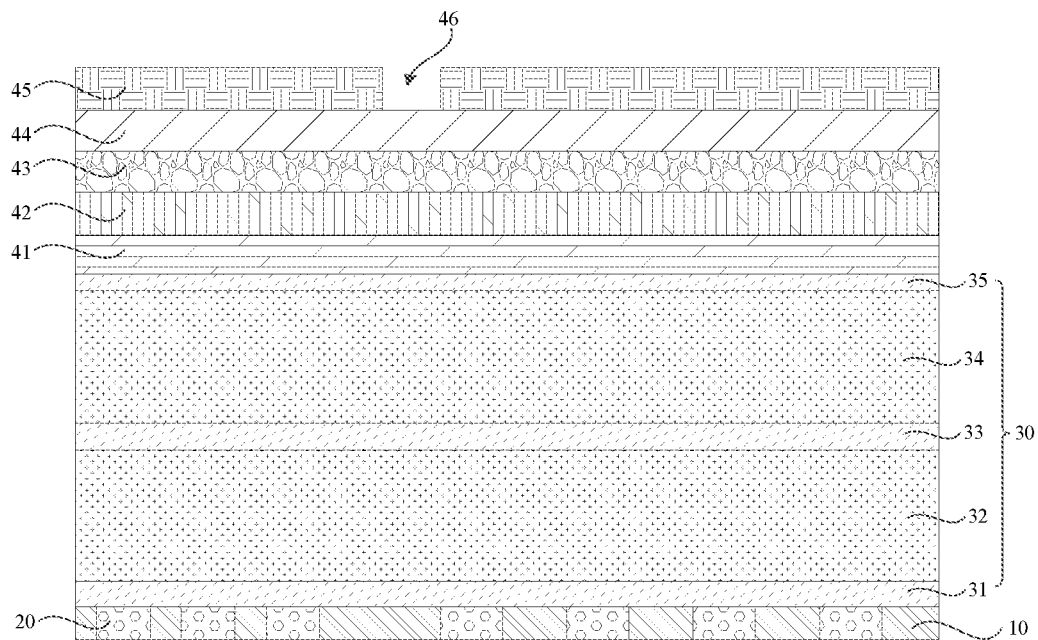
FIG. 2 is a schematic diagram of forming an opening in a method of manufacturing a semiconductor structure according to an exemplary embodiment.

As shown in FIG. 2, in step S100, a base 10 may be made of a semiconductor material. The semiconductor material may be one or more of silicon, germanium, a silicon-germanium compound, and a silicon-carbon compound. In this embodiment, the base 10 is made of silicon. That the base 10 is made of silicon in this embodiment is to facilitate understanding of a subsequent forming method by those skilled in the art, rather than to constitute a limitation. In an actual application process, an appropriate material of the base may be selected as required.

Referring to FIG. 2, spaced contact structures 20 are formed on a surface of the base 10.

The contact structure 20 may be provided on at least one of a source region, a drain region, and a gate structure of an active region in the base 10 and used as an electrode lead-out structure, to help apply a working voltage to the active region, to generate a working current. For example, when the contact structure 20 is provided on the source region, the contact structure 20 serves as a capacitor contact structure and is connected to a capacitor structure. For another example, when the contact structure 20 is provided on the drain region, the contact structure 20 serves as a bit line contact structure and is connected to a bit line. For still another example, when the contact structure 20 is provided on the gate structure, the contact structure 20 is used for a structure connection such as a connection to the gate structure and a pad of a chip, to help an external portion apply a voltage to the chip. A material of the contact structure 20 may include, but is not limited to, polycrystalline silicon, titanium nitride, or tungsten.

In step S200, referring to FIG. 2, a stacked structure 30 may include a plurality of support layers and a plurality of sacrificial layers, for example, there are three support layers and two sacrificial layers. The support layers and the sacrificial layers are is alternately provided and the first support layer is provided on a top surface of the base 10.

Figure 4:
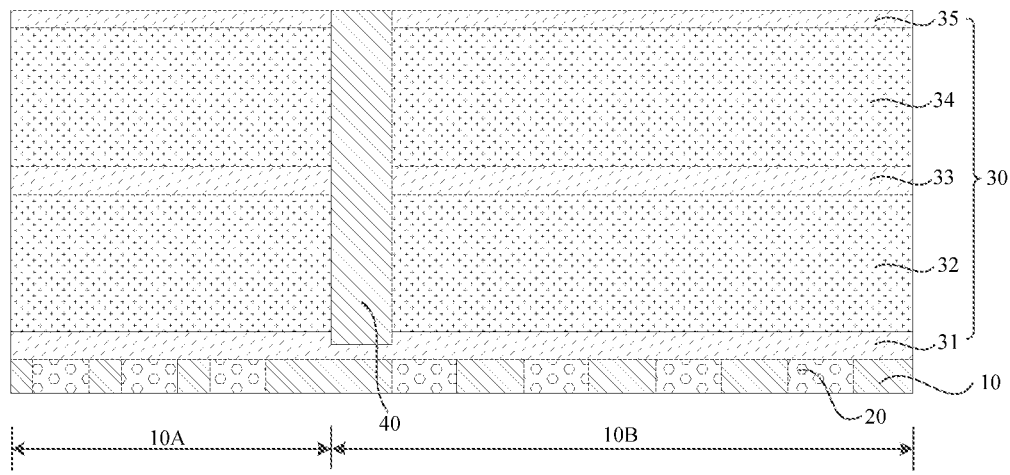
FIG. 4 is a schematic diagram of forming an isolation structure in a method of manufacturing a semiconductor structure according to an exemplary embodiment.
Figure 18:
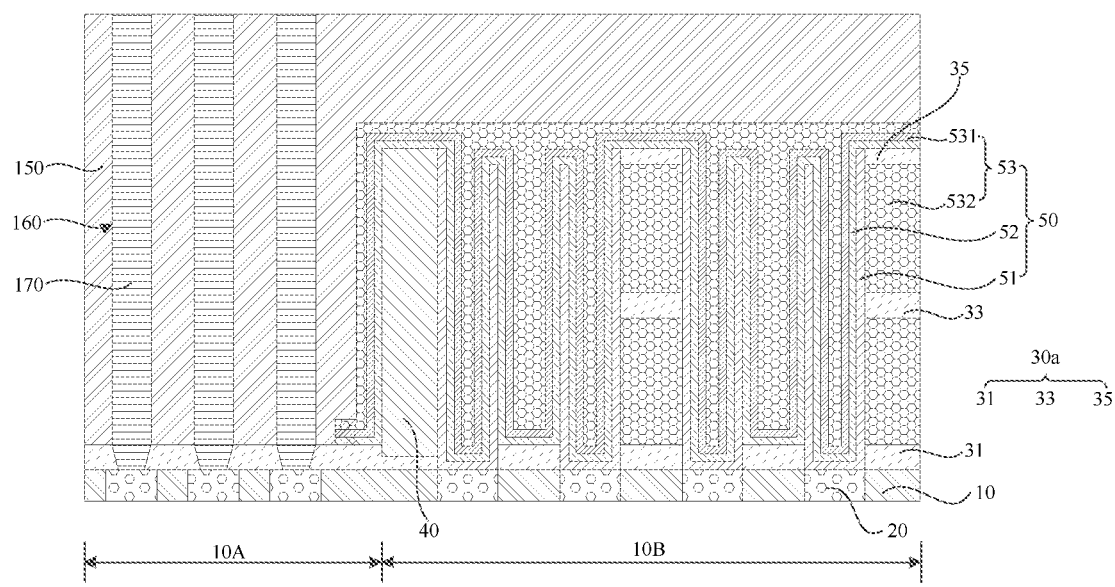
FIG. 18 is a schematic diagram of forming a contact plug in a method of manufacturing a semiconductor structure according to an exemplary embodiment.

As shown in FIG. 4 and FIG. 18, in step S300, the isolation structure 40 divides the base 10 into a first region 10A and a second region 10B, where the first region 10A may be configured to form a contact plug 170 and the like, and the second region 10B may be configured to form capacitor structures 50 arranged in an array, and the like. In this embodiment, a side of the isolation structure 40 facing the first region 10A is defined as a boundary of an array region.

Figure 16:
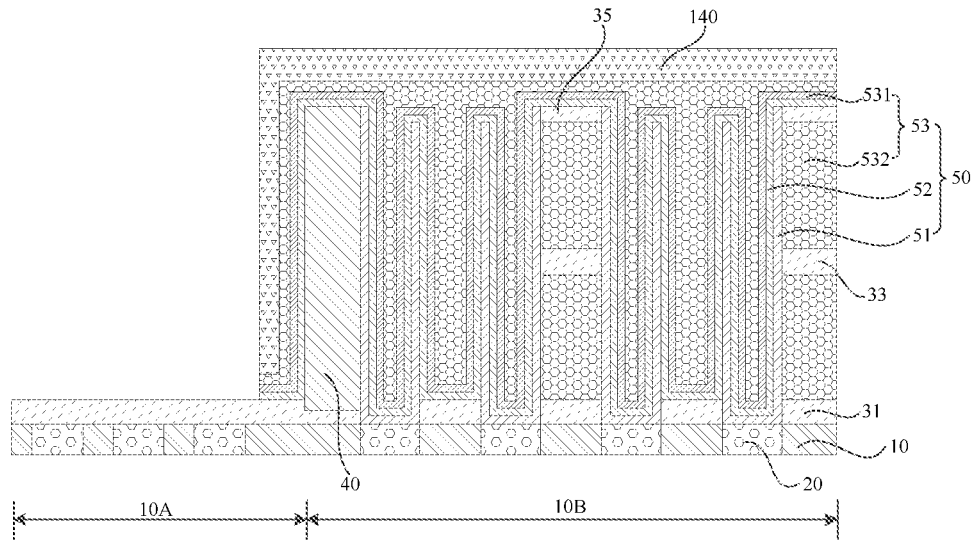
FIG. 16 is a schematic diagram of forming a capacitor structure in a method of manufacturing a semiconductor structure according to an exemplary embodiment.

In step S400, referring to FIG. 16, the capacitor structure 50 formed in the second region 10B may include a first electrode layer 51, a dielectric layer 52, a second electrode layer 531, and a buffer layer 532. The first electrode layer 51 is connected to the contact structure 20 and used as a bottom electrode of the capacitor structure 50. The dielectric layer 52 wraps a surface of the first electrode layer 51. The second electrode layer 531 wraps a surface of the dielectric layer 52. The buffer layer 532 is provided on a surface of the second electrode layer 531, and the buffer layer 532 is configured to: reduce a stress in a process of forming the capacitor structure 50, and constitute a top electrode of the capacitor structure 50 together with the second electrode layer 531.

Figure 17:
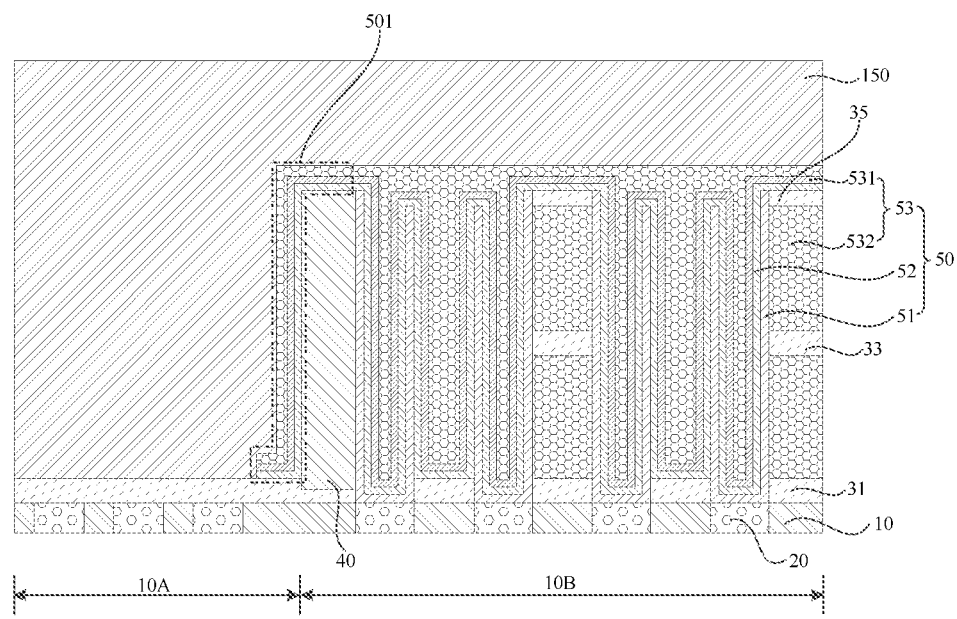
FIG. 17 is a schematic diagram of forming a second dielectric layer in a method of manufacturing a semiconductor structure according to an exemplary embodiment.

As shown in FIG. 17, the capacitor structure 50 has an extension portion 501 along a direction toward the first region 10A, where the extension portion 501 extends into the first region 10A and covers a top surface and a sidewall of the isolation structure 40. In this embodiment, the isolation structure connected to the base is formed in the stacked structure, and the base is divided into the first region and the second region by using the isolation structure, where the first region is configured to form the contact plug connected to the contact structure, and the second region is configured to form the capacitor structure connected to the contact structure. Because the isolation structure is provided along the direction perpendicular to the base, the second region is enabled to obtain a flat boundary, to improve the density uniformity of a filling material used for subsequently forming a semiconductor structure layer (such as a dielectric layer and a contact plug) in the first region, and prevent a crack from being formed in the filling material when the filling material is deposited or when the filling material is processed (such as chemical mechanical polishing), such that a short-circuit problem between semiconductor structures (such as adjacent contact plugs or a contact plug and a boundary of an array region) in the first region is effectively avoided, thereby improving electrical properties and yields of the semiconductor structures.

According to an exemplary embodiment, this embodiment is a further description of step S200.

As shown in FIG. 2, in this embodiment, the stacked structure 30 may be formed in the following method:

sequentially forming, through deposition on the top surface of the base 10, a first support layer 31, a first sacrificial layer 32, a second support layer 33, a second sacrificial layer 34, and a third support layer 35 by using one or more of an atomic layer deposition process, a physical vapor deposition process, or a chemical vapor deposition process along a direction from a bottom surface of the base 10 to the top surface of the base 10. The first support layer 31 covers a plurality of contact structures 20 discretely provided on the surface of the base 10.

In this embodiment, there are three spaced support layers. The three support layers sequentially spaced from bottom to top are provided, to provide a stable and balanced support structure for a subsequently formed capacitor structure, such that the stability of the capacitor structure is ensured. Support layers of the first support layer 31, the second support layer 33, and the third support layer 35 may be made of a same material or different materials. The materials of the first support layer 31, the second support layer 33, and the third support layer 35 may include, but are not limited to, silicon nitride or silicon carbonitride.

In an example, the first support layer 31, the second support layer 33, and the third support layer 35 may have a same thickness, such that a same deposition process parameter can be used in a process of forming the support layers, thereby reducing the difficulty of a manufacturing process of the stacked structure 30, and reducing process costs.

In another example, both a thickness of the third support layer 35 and a thickness of the second support layer 33 are greater than a thickness of the first support layer 31. In is this case, support stability of top and middle positions of the capacitor structure is ensured, to ensure that the top and middle positions of the capacitor structure do not collapse due to a stress of a deposited support layer material, and avoid a short-circuit problem of a semiconductor structure caused by bridging.

There are two spaced sacrificial layers. The two sacrificial layers of the first sacrificial layer 32 and the second sacrificial layer 34 may be made of a same material or different materials. Materials of the first sacrificial layer 32 and the second sacrificial layer 34 may include, but are not limited to, oxide or polycrystalline silicon. The first sacrificial layer 32 and the second sacrificial layer 34 are to be removed in a subsequent manufacturing process, to help form the capacitor structure.

According to an exemplary embodiment, this embodiment is a further description of step S300 described above.

Figure 3:
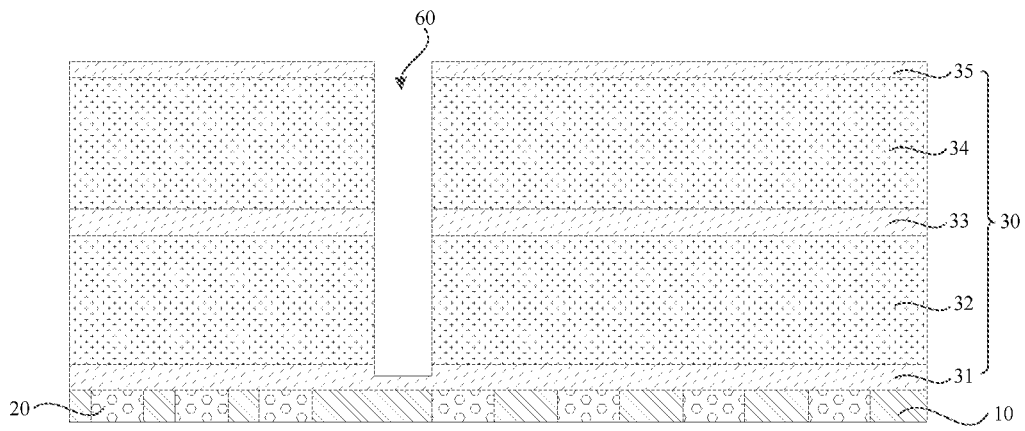
FIG. 3 is a schematic diagram of forming an isolation hole in a method of manufacturing a semiconductor structure according to an exemplary embodiment.

As shown in FIG. 3 and FIG. 4, after the stacked structure 30 is formed, an isolation structure 40 is formed on the stacked structure 30. The isolation structure 40 runs through the third support layer 35, the second sacrificial layer 34, the second support layer 33, and the first sacrificial layer 32 sequentially along the direction perpendicular to the base 10, and is connected to the base 10 through the first support layer 31, that is, the isolation structure 40 is connected to the first support layer 31 and the first support layer 31 is connected to the base 10. In an example, based on an orientation shown in FIG. 4, the bottom of the isolation structure 40 extends into the first support layer 31.

The isolation structure 40 may be formed by using the following method.

Referring to FIG. 2, a polycrystalline silicon layer 41, a third dielectric layer 42, a spin-on-carbon layer 43, a reflective layer 44, and a first photoresist layer 45 that are provided in a stacked manner are sequentially formed on the third support layer 35 by using a deposition process.

The first photoresist layer 45 is patterned to form an opening 46 on the first photoresist layer 45.

Then, the first photoresist layer 45, the reflective layer 44, the spin-on-carbon layer 43, the third dielectric layer 42, the polycrystalline silicon layer 41, the third support layer 35, the second sacrificial layer 34, the second support layer 33, and the first sacrificial is layer 32 are sequentially etched by using the patterned first photoresist layer 45 on which the opening 46 is formed as a mask along the direction perpendicular to the base 10 from top to bottom, to form an isolation hole 60 running through the foregoing structures. After the isolation hole 60 is formed, the first photoresist layer 45, the reflective layer 44, the spin-on-carbon layer 43, the third dielectric layer 42, and the polycrystalline silicon layer 41 are removed, to form the structure shown in FIG. 3.

Then, referring to FIG. 4, the isolation hole 60 is filled with an isolation material by using one or more of the atomic layer deposition process, the physical vapor deposition process, or the chemical vapor deposition process, to form the isolation structure 40. A bottom surface of the isolation structure 40 is connected to the base 10 through the first support layer 31, and a top surface of the isolation structure 40 is flush with a top surface of the third support layer 35. The isolation material may include, but is not limited to, silicon nitride.

In this embodiment, through a pattern transfer process, the accuracy of a forming position of the isolation hole is improved and the forming accuracy of the isolation hole is improved. In addition, the method of forming the isolation structure is simple and easy to control and does not increase the difficulty of the manufacturing process of the semiconductor structure. The isolation structure is used to enable the second region to obtain a flat boundary, so as to increase a density of a filling material (such as a second dielectric layer and a contact plug) in the first region in a filling process, and prevent a crack from being formed inside the filling material when the filling material is formed or the filling material is processed (such as chemical mechanical polishing), such that a short-circuit problem in the first region is effectively avoided, thereby improving electrical properties and yields of semiconductor structures.

According to an exemplary embodiment, this embodiment is a further description of step S400 described above.

As shown in FIG. 5 to FIG. 17, after the isolation structure 40 is formed, the isolation structure 40 divides the base 10 into a first region 10A and a second region 10B, where the first region 10A may be configured to form a structure such as a contact plug, and the second region 10B may be configured to form capacitor structures 50 and the like.

The capacitor structure 50 may be formed by using the following method.

Figure 5:
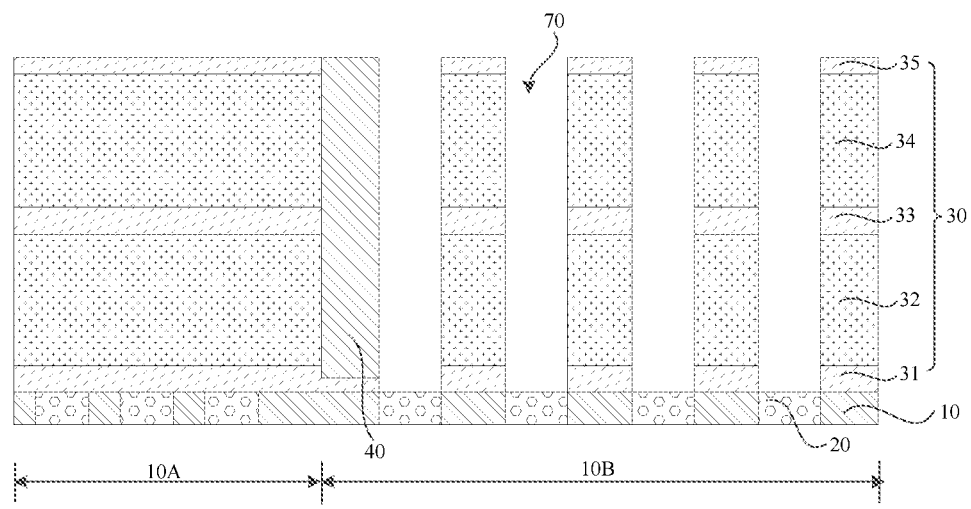
FIG. 5 is a schematic diagram of forming a capacitor hole in a method of manufacturing a semiconductor structure according to an exemplary embodiment.

First, referring to FIG. 5, the stacked structure 30 located in the second region 10B is etched, to form a plurality of capacitor holes 70 that are spaced in the second region 10B. The bottom of the capacitor hole 70 exposes the top surface of the contact structure 20. The plurality of capacitor holes 70 are one-to-one corresponding to the plurality of contact structures 20 in the second region 10B.

Figure 12:
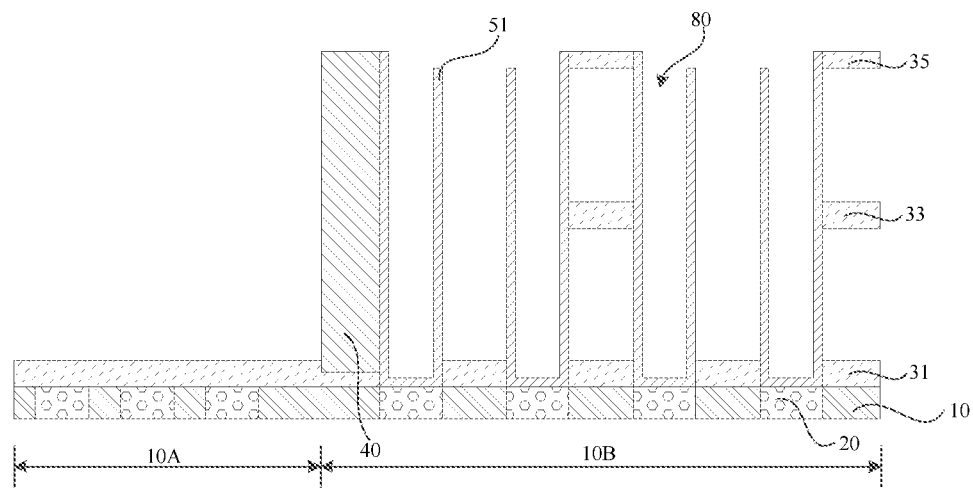
FIG. 12 is a schematic diagram of removing a first sacrificial layer in a method of manufacturing a semiconductor structure according to an exemplary embodiment.

Then, referring to FIG. 5 and FIG. 12, a first electrode layer 51 is formed on a sidewall of the capacitor hole 70 by using one or more of the atomic layer deposition process, the physical vapor deposition process, or the chemical vapor deposition process, where the first electrode layer 51 may be a bottom electrode in a capacitor. A material of the first electrode layer 51 may include, but is not limited to, tungsten, polycrystalline silicon, or titanium nitride. After the first electrode layer 51 is formed, the first electrode layer 51 on an inner wall of the capacitor hole 70 forms a first recess 80.

Then, referring to FIG. 12 and FIG. 16, a dielectric layer 52 is formed on an inner wall of the first recess 80 by using one or more of the atomic layer deposition process, the physical vapor deposition process, or the chemical vapor deposition process. An end of the dielectric layer 52 extends out of the first recess 80 and covers the top surface and the sidewall of the isolation structure 40.

Still referring to FIG. 16, a second electrode structure 53 wrapping an outer surface of the dielectric layer 52 is formed by using one or more of the atomic layer deposition process, the physical vapor deposition process, or the chemical vapor deposition process. An end of the second electrode structure 53 extends to cover a top surface of the dielectric layer 52 located on the top surface and the sidewall of the isolation structure 40. Herein, it should be noted that, when a relative position of the second electrode structure 53 relative to the dielectric layer 52 is described, involved orientations such as an inside and an outside are based on orientations shown in FIG. 12 and FIG. 13, that is, a side of the dielectric layer 52 close to the first recess 80 is an outer surface of the dielectric layer 52, and a side of the dielectric layer 52 away from the first recess 80 is an inner surface of the dielectric layer 52.

As shown in FIG. 17, the dielectric layer 52 located on the top surface of the isolation is structure 40 and the sidewall of the isolation structure 40 toward a direction of the first region 10A and the second electrode structure 53 form an extension portion 501.

In this embodiment, the first electrode layer, the dielectric layer, and the second electrode structure form a capacitor structure, where the dielectric layer may be made of a high-K material, to effectively improve an insulating effect between the first electrode layer and the second electrode structure, and avoid current leakage between the first electrode layer and the second electrode structure, thereby improving the performance of the semiconductor structure.

According to an exemplary embodiment, this embodiment is a further description of a forming process of the first electrode layer 51.

As shown in FIG. 6 to FIG. 13, the forming process of the first electrode layer 51 is as follows.

Figure 6:
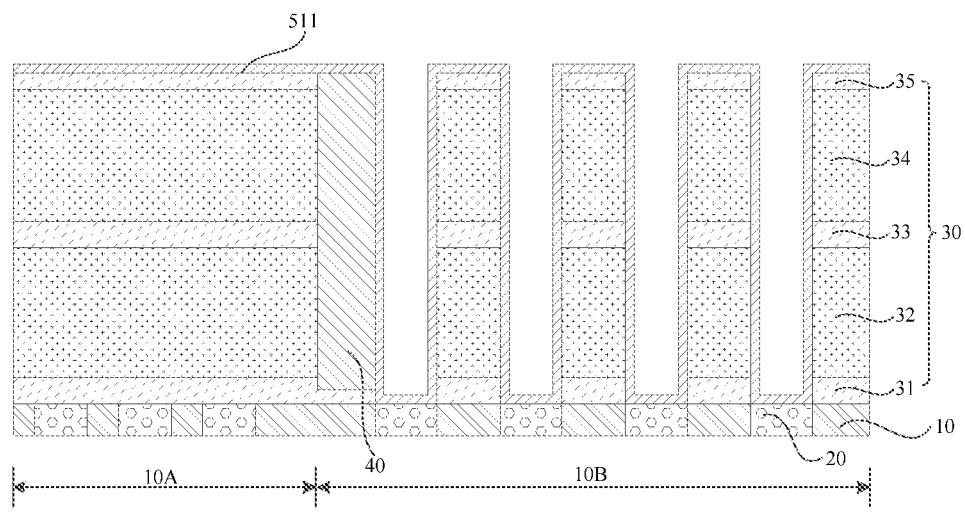
FIG. 6 is a schematic diagram of forming a first initial electrode layer in a method of manufacturing a semiconductor structure according to an exemplary embodiment.

Referring to FIG. 5 and FIG. 6, a first initial electrode layer 511 is formed inside the capacitor hole 70 by using one or more of the atomic layer deposition process, the physical vapor deposition process, or the chemical vapor deposition process. The first initial electrode layer 511 extends out of the capacitor hole 70 and covers a top surface of the stacked structure 30 and the top surface of the isolation structure 40 in the first region 10A, where the first initial electrode layer 511 further covers a top surface of the stacked structure 30 located in the second region 10B.

Figure 9:
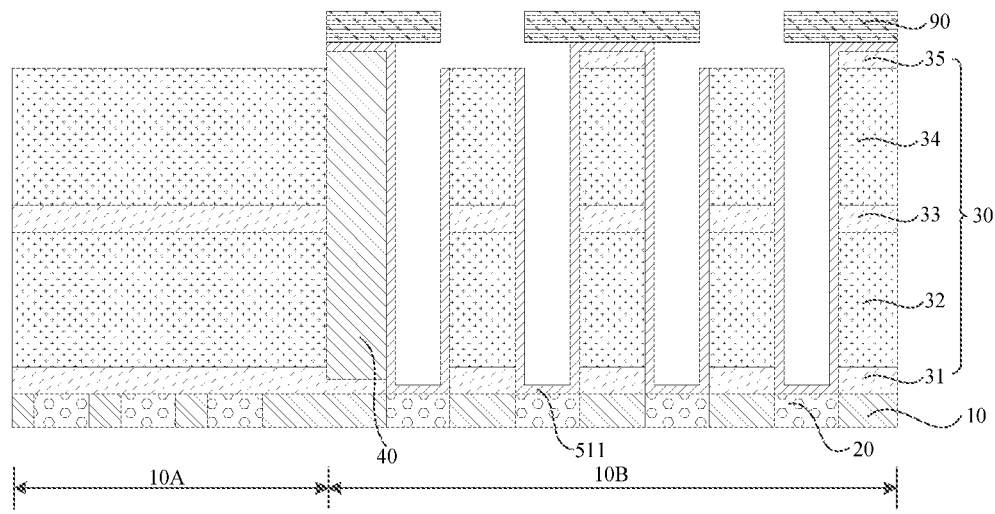
FIG. 9 is a schematic diagram of removing part of a first initial electrode layer in a method of manufacturing a semiconductor structure according to an exemplary embodiment.

In a same etching step, part of the first initial electrode layer 511 between adjacent capacitor holes 70 and located on the top surface of the third support layer 35 is removed, and part of the first initial electrode layer 511 located on the top surface of the stacked structure 30 in the first region 10A is removed, to obtain a structure shown in FIG. 9.

Figure 11:
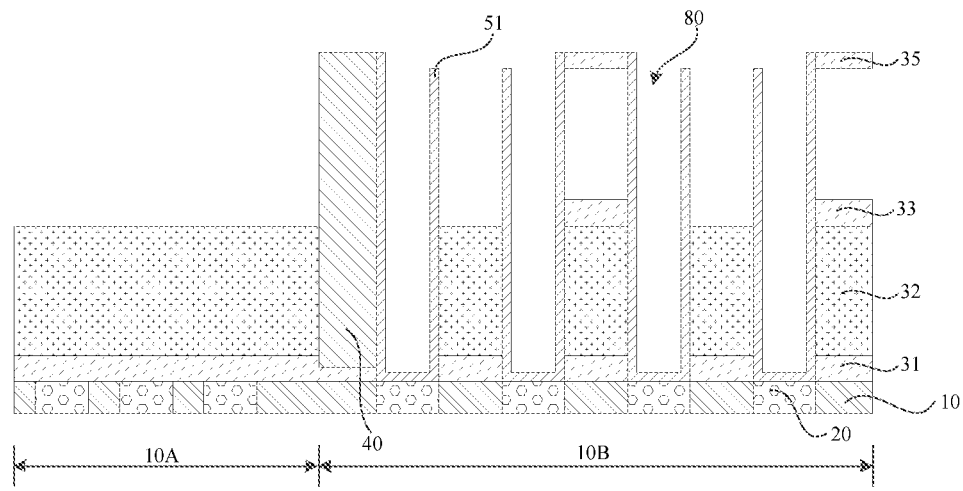
FIG. 11 is a schematic diagram of forming a first electrode layer and a first recess in a method of manufacturing a semiconductor structure according to an exemplary embodiment.

Then, referring to FIG. 11, the first initial electrode layer 511 located on the top surface of the isolation structure 40 is removed by still using the etching processing process. The remaining part of the first initial electrode layer 511 forms the first electrode layer 51.

In this embodiment, the etching processing process is used twice to separately remove the part of the first initial electrode layer, where the remaining part of the first initial electrode layer forms the first electrode layer, to improve the forming accuracy of the first electrode layer, thereby ensuring the performance of the semiconductor structure.

In a same etching step, part of the first initial electrode layer 511 may be removed by using the following method.

Figure 7:
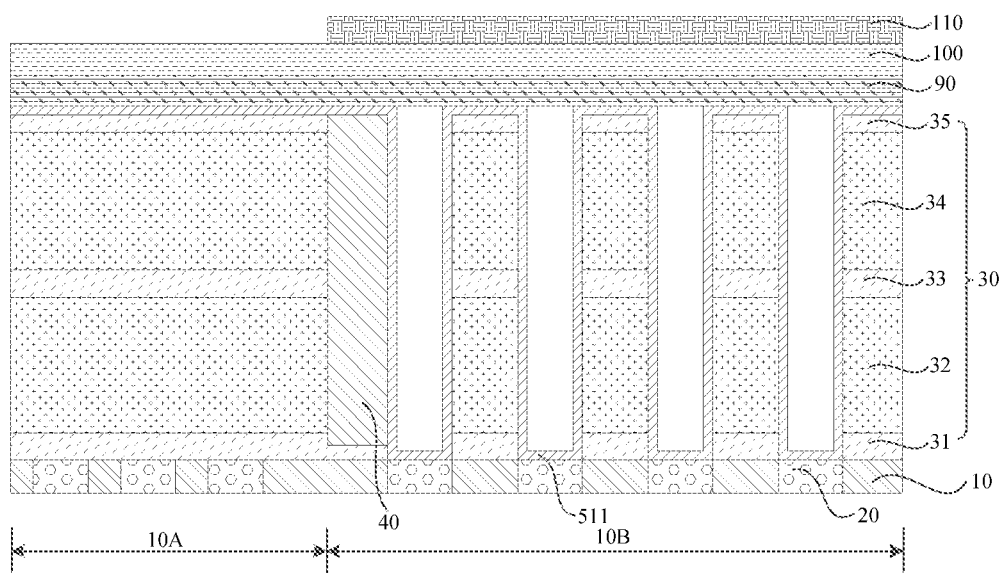
FIG. 7 is a schematic diagram of forming a first dielectric layer and a dielectric anti-reflective coating layer in a method of manufacturing a semiconductor structure according to an exemplary embodiment.

Referring to FIG. 7, a first dielectric layer 90 and a dielectric anti-reflective coating layer 100 that are stacked are formed on the first initial electrode layer 511 by using one or more of the atomic layer deposition process, the physical vapor deposition process, or the chemical vapor deposition process.

Then, a second photoresist layer 110 is deposited on a top surface of the dielectric anti-reflective coating layer 100.

Figure 8:
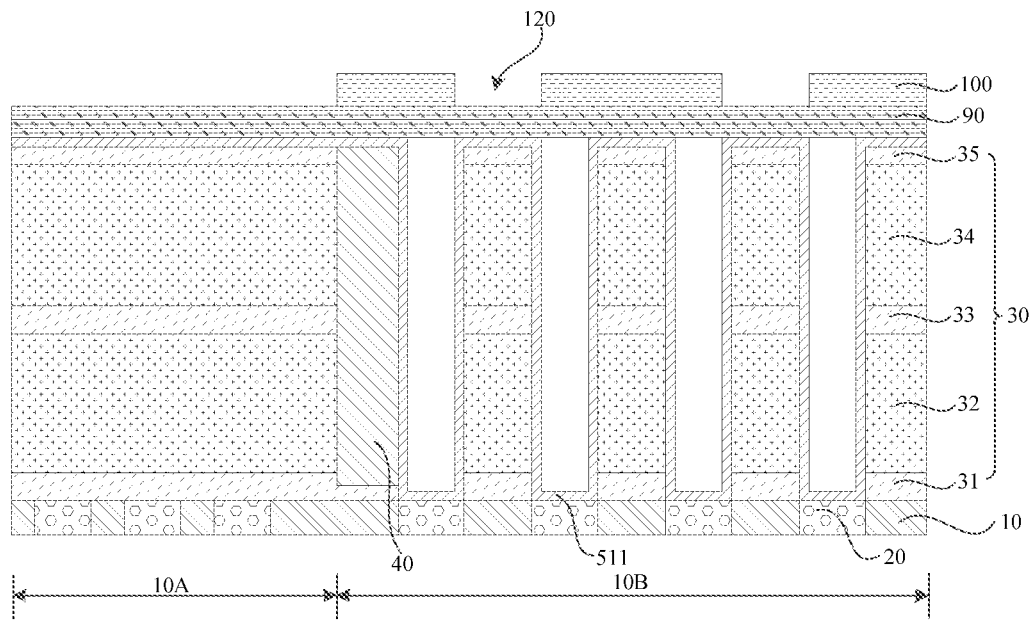
FIG. 8 is a schematic diagram of forming a first opening in a method of manufacturing a semiconductor structure according to an exemplary embodiment.

Referring to FIG. 8, the second photoresist layer 110 and the dielectric anti-reflective coating layer 100 are patterned to form a first opening 120 on the dielectric anti-reflective coating layer 100. The first opening 120 is corresponding to the stacked structure 30 between adjacent capacitor holes 70.

Referring to FIG. 9, part of the first dielectric layer 90 and part of the first initial electrode layer 511 that is in the first region 10A and the second region 10B are removed based on the first opening 120 through an etching processing process by using the patterned dielectric anti-reflective coating layer 100 as a mask along the direction perpendicular to the base 10. Part of the third support layer 35 in the first region 10A and the second region 10B is removed through etching by still using the patterned dielectric anti-reflective coating layer 100 as a mask, to expose part of a top surface of the second sacrificial layer 34.

In this embodiment, the accuracy of forming the first opening on the dielectric anti-reflective coating layer can be improved by using the first dielectric layer and the dielectric anti-reflective coating layer that are stacked, such that part of the first initial electrode layer is accurately removed to prepare for subsequently removing, through second etching, part of the first initial electrode layer, thereby effectively ensuring the quality of the subsequently formed first electrode layer.

The first initial electrode layer 511 located on the top surface of the isolation structure continues to be removed, and a removing process of the part of the first initial electrode layer 511 may be performed by using the following method.

Figure 10:
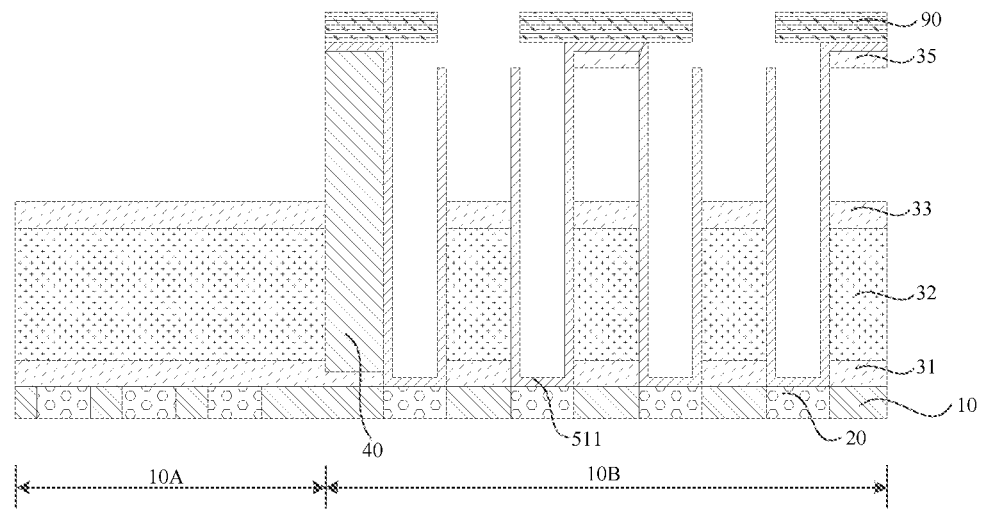
FIG. 10 is a schematic diagram of removing a second sacrificial layer in a method of manufacturing a semiconductor structure according to an exemplary embodiment.

As shown in FIG. 10, the second sacrificial layer 34 is removed, where a removing process of the second sacrificial layer 34 may include dry etching or wet etching.

Referring to FIG. 10 and FIG. 11, the remaining part of the first dielectric layer 90 and the first initial electrode layer 511 located on the top surface of the isolation structure 40 are removed by using the etching processing process, and further the first initial electrode layer 511 on a top surface of the remaining part of the third support layer 35 is removed.

Referring to FIG. 11, after the first initial electrode layer 511 on the top surface of the isolation structure 40 and the first initial electrode layer 511 on the top surface of the remaining part of the third support layer 35 are removed, the second support layer 33 located in the first region 10A and part of the second support layer 33 located in the second region 10B are removed by using the etching processing process.

Referring to FIG. 12, the first sacrificial layer 32 is removed through an etching processing process or an acid pickling process. In this step, the entire first sacrificial layer 32 in the first region 10A and the second region 10B is removed in a uniform removing manner. The remaining part of the first initial electrode layer 511 forms the first electrode layer 51, to help subsequently form the dielectric layer 52 and the second electrode structure 53 in the capacitor structure 50.

According to an exemplary embodiment, this embodiment is a further description of a forming process of the dielectric layer 52.

Figure 13:
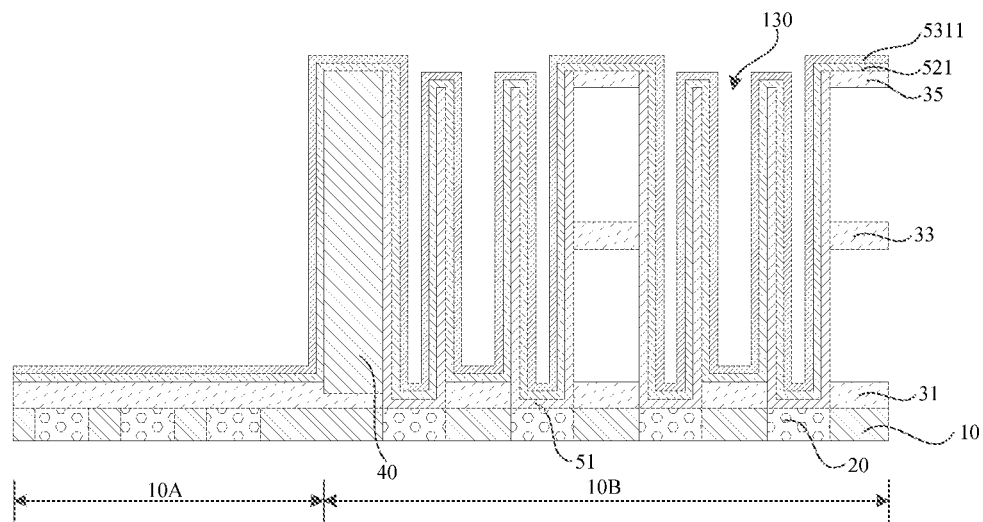
FIG. 13 is a schematic diagram of forming an initial dielectric layer and a second initial electrode layer in a method of manufacturing a semiconductor structure according to an exemplary embodiment.

As shown in FIG. 12 and FIG. 13, an initial dielectric layer 521 is formed on the inner wall of the first recess 80 by using one or more of the atomic layer deposition process, the physical vapor deposition process, or the chemical vapor deposition process. The initial dielectric layer 521 extends out of the first recess 80 and covers the first support layer 31 in the first region 10A and the top surface and the sidewall of the isolation structure 40.

For the initial dielectric layer 521 formed in this step, after the second electrode structure 53 is subsequently formed, part of the initial dielectric layer 521 in the first region 10A is removed, where the remaining part of the initial dielectric layer 521 forms the dielectric layer 52.

A material of the initial dielectric layer 521 may include, but is not limited to, a high-K is material. The high-K material may be, for example, one of zirconium oxide (ZrOx), hafnium oxide (HfOx), titanium zirconium oxide (ZrTiOx), ruthenium oxide (RuOx), aluminum oxide (AlOx), or a combination thereof. That is, the material of the dielectric layer may be one of the above materials, or may be a mixture of the above materials. The material of the initial dielectric layer 521 is the high-K material, to help increase a capacitance of the subsequent capacitor structure per unit area and increase a storage capacity of the subsequently formed capacitor structure 50, thereby improving the performance of a semiconductor structure.

According to an exemplary embodiment, this embodiment is a further description of a forming process of the second electrode structure 53.

As shown in FIG. 13, a second initial electrode layer 5311 is formed on an outer surface of the initial dielectric layer 521 through deposition by using one or more of the atomic layer deposition process, the physical vapor deposition process, or the chemical vapor deposition process, and a second recess 130 is formed on the second initial electrode layer 5311 in the second region 10B. A material of the second initial electrode layer 5311 may include, but is not limited to, polycrystalline silicon, tungsten, or titanium nitride. Herein, it should be noted that, when a relative position of the second electrode structure 53 relative to the dielectric layer 52 is described, involved orientations such as an inside and an outside are based on orientations shown in FIG. 12 and FIG. 13, that is, a side of the dielectric layer 52 close to the first recess 80 is an outer surface of the dielectric layer 52, and a side of the dielectric layer 52 away from the first recess 80 is an inner surface of the dielectric layer 52.

Figure 14:
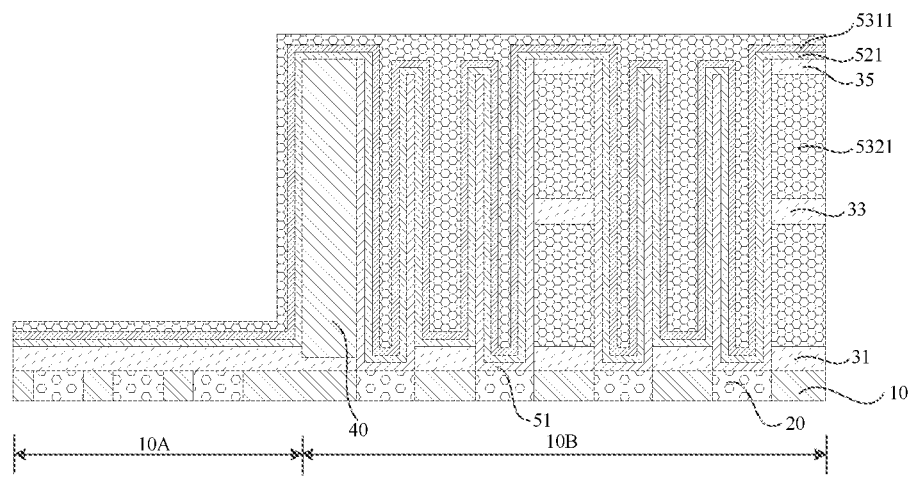
FIG. 14 is a schematic diagram of forming an initial buffer layer in a method of manufacturing a semiconductor structure according to an exemplary embodiment.

Then, referring to FIG. 14, an initial buffer layer 5321 is formed in the second recess 130 by still using the deposition process. The initial buffer layer 5321 fills up the second recess 130 and covers the second initial electrode layer 5311 located in the first region 10A, where a material of the initial buffer layer 5321 may include, but is not limited to, polycrystalline silicon.

Figure 15:
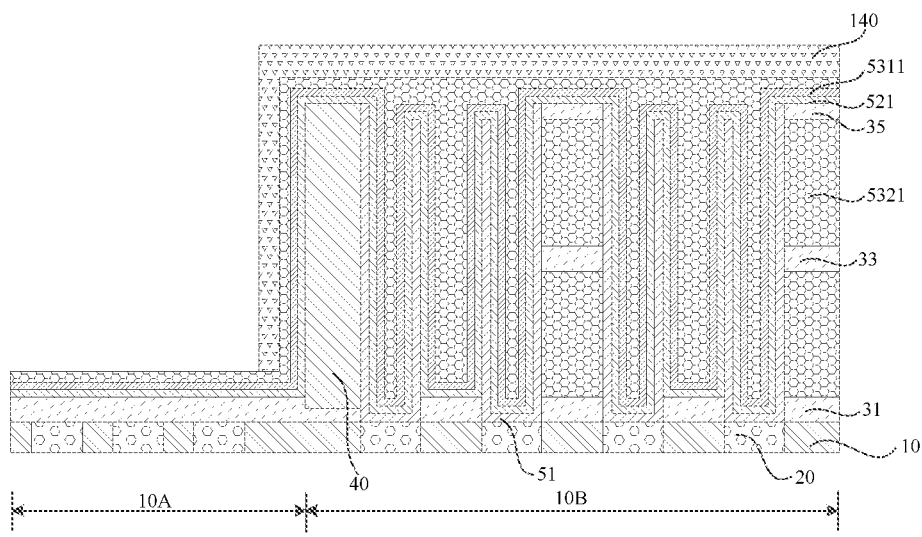
FIG. 15 is a schematic diagram of forming a third photoresist layer in a method of manufacturing a semiconductor structure according to an exemplary embodiment.

Referring to FIG. 15, a third photoresist layer 140 is formed on a top surface of the initial buffer layer 5321. The third photoresist layer 140 covers the initial buffer layer 5321 located in the second region 10B and part of the initial buffer layer 5321 located in the first region 10A.

Referring to FIG. 15 and FIG. 16, part of the initial dielectric layer 521, part of the second initial electrode layer 5311, and part of the initial buffer layer 5321 that are located in the first region 10A are removed by using the etching processing process along the direction perpendicular to the base 10. The remaining part of the initial dielectric layer 521, the remaining part of the second initial electrode layer 5311, and the remaining part of the initial buffer layer 5321 respectively form the dielectric layer 52, the second electrode layer 531, and the buffer layer 532, where the second electrode layer 531 and the buffer layer 532 together constitute the second electrode structure 53.

Finally, the third photoresist layer 140 is removed.

In this embodiment, the second electrode layer and the buffer layer together constitute the second electrode structure, and the buffer layer wraps an outer surface of the second electrode layer, to reduce, by using the buffer layer, a stress in a process of forming the capacitor structure, thereby improving the stability of the capacitor structure.

According to an exemplary embodiment, as shown in FIG. 17 and FIG. 18, this embodiment includes the method in the foregoing embodiment, and details are not described herein again. A difference from the foregoing embodiment lies in that, in this embodiment, after the capacitor structure 50 is formed, a method of manufacturing a semiconductor structure in this embodiment may further include the following steps.

Referring to FIG. 17, a second dielectric layer 150 is formed on the first support layer 31 of the first region 10A by using one or more of the atomic layer deposition process, the physical vapor deposition process, or the chemical vapor deposition process. The second dielectric layer 150 extends into the second region 10B and covers the buffer layer 532 of the second electrode structure 53.

Referring to FIG. 18, spaced contact openings 160 are formed in the first region 10A by using the etching processing process. A plurality of contact openings 160 are corresponding to a plurality of contact structures 20 in the first region 10A and expose top surfaces of the contact structures 20.

Then, a contact plug 170 is formed in the contact opening 160 by using one or more of the atomic layer deposition process, the physical vapor deposition process, or the chemical vapor deposition process.

In this embodiment, the isolation structure is configured to define an edge of the second region to enable the second region to obtain a flat boundary, so as to increase a density of a filling material (such as a second dielectric layer and a contact plug) in the first region in a filling process, and prevent a crack from being formed inside the filling material when the filling material is formed or the filling material is processed (such as chemical mechanical polishing), such that a short-circuit problem between semiconductor structures (such as adjacent contact plugs or a contact plug and a boundary of an array region) in the first region is effectively avoided, thereby improving electrical properties and yields of the semiconductor structures.

As shown in FIG. 18, an exemplary embodiment of the present disclosure provides a semiconductor structure. The semiconductor structure includes a base 10, a support structure 30a, an isolation structure 40, and capacitor structures 50.

Spaced contact structures 20 are provided on a surface of the base 10.

The support structure 30a is provided on the base 10 and the support structure 30a includes a plurality of spaced support layers.

The isolation structure 40 is provided along a direction perpendicular to the base 10 and is connected to the base 10 through part of the support layer, and the isolation structure 40 divides the base 10 into a first region 10A and a second region 10B. The first region 10A may be configured to form a device structure such as a contact plug 170, and the second region 10B may be configured to form a device structure such as capacitor structures 50 arranged in an array.

The capacitor structures 50 are spaced in the support structure 30a in the second region 10B and correspondingly connected to a plurality of contact structures 20 in the second region 10B.

In this embodiment, the base is divided into the first region and the second region by using the isolation structure, where the isolation structure is provided along a direction perpendicular to the base, to enable the second region to obtain a flat boundary, such that a short-circuit problem between semiconductor structures (such as adjacent contact plugs or a contact plug and a boundary of an array region) in the first region is effectively is avoided, thereby improving electrical properties and yields of the semiconductor structure.

In some embodiments, as shown in FIG. 18, the capacitor structure 50 includes a first electrode layer 51, a dielectric layer 52, and a second electrode structure 53, where the first electrode layer 51 is connected to the contact structure 20, a sidewall of the first electrode layer 51 is connected to the support structure 30a, and the first support layer 31, the second support layer 33, and the third support layer 35 that are in the support structure 30a may support the first electrode layer 51. The dielectric layer 52 covers the first electrode layer 51 and an exposed surface of the support structure 30a and extends to the first region 10A to cover a top surface and a sidewall of the isolation structure 40. For example, the dielectric layer 52 covers an exposed top surface and an exposed bottom surface of the second support layer 33 and the third support layer 35. In addition, the dielectric layer 52 further covers the top surface of the isolation structure 40 and a sidewall thereof toward a side of the first region 10A and covers the first electrode layer 51 on the sidewall of the isolation structure 40 toward a side of the second region 10B. The second electrode structure 53 covers the dielectric layer 52.

In some embodiments, as shown in FIG. 18, the support structure 30a includes the first support layer 31, the second support layer 33, and the third support layer 35 that are sequentially spaced from bottom to top. The first support layer 31 is located on an upper surface of the base 10 and connected to a sidewall of part of the first electrode layer 51. The second support layer 33 and the third support layer 35 are provided in parallel to the first support layer 31 and are connected to a sidewall of part of the first electrode layer 51, to ensure the stability of the capacitor structure, thereby increasing a depth-width ratio of the capacitor structure 50 and further increasing a storage capacity of the capacitor structure 50. The bottom of the isolation structure 40 is connected to the base 10 through the first support layer 31.

In some embodiments, as shown in FIG. 18, the second electrode structure 53 includes a second electrode layer 531 and a buffer layer 532, the second electrode layer 531 covers the dielectric layer 52, and the buffer layer 532 covers the second electrode layer 531, to reduce a stress in a process of forming the capacitor structure 50, thereby improving the stability of the semiconductor structure.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific is details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A method of manufacturing a semiconductor structure, wherein the method of manufacturing the semiconductor structure comprises:
   providing a base, wherein spaced contact structures are formed on a surface of the base;
   forming, on the base, a stacked structure comprising alternately stacked a support layer and a sacrificial layer, wherein the stacked structure covers the contact structure;
   forming an isolation structure in the stacked structure, wherein the isolation structure runs through the sacrificial layer and part of the support layer along a direction perpendicular to the base, and is connected to the base through part of a remaining support layer, to divide the base into a first region and a second region; and
   forming a capacitor structure in the second region, wherein the capacitor structure is correspondingly connected to the contact structure in the second region;
   wherein the forming, on the base, a stacked structure comprising a support layer and a sacrificial layer that are alternately stacked comprises:
   forming, on the base, a first support layer, a first sacrificial layer, a second support layer, a second sacrificial layer, and a third support layer that are stacked, wherein the first support layer, the second support layer, and the third support layer form a support structure;
   wherein the forming an isolation structure in the stacked structure comprises:
   etching the third support layer, the second sacrificial layer, the second support layer, and the first sacrificial layer along the direction perpendicular to the base, to form an isolation hole; and
   filling the isolation hole with an isolation material to form the isolation structure, wherein a bottom surface of the isolation structure is connected to the base through the first support layer, and a top surface of the isolation structure is flush with a top surface of the third support layer;
   wherein a material of the isolation structure is silicon nitride.

2. The method of manufacturing the semiconductor structure according to claim 1, wherein the capacitor structure has an extension portion along a direction toward the first region, and the extension portion extends into the first region and covers a top surface and a sidewall of the isolation structure.

3. The method of manufacturing the semiconductor structure according to claim 1, wherein the forming capacitor structures in the second region comprises:
   forming spaced capacitor holes in the second region, wherein a bottom of the capacitor hole exposes a top surface of the contact structure;
   forming a first electrode layer on an inner wall of the capacitor hole, wherein the first electrode layer in the capacitor hole forms a first recess;
   forming a dielectric layer on an inner wall of the first recess, wherein an end of the dielectric layer toward the isolation structure extends out of the first recess and covers the top surface and a sidewall of the isolation structure; and
   forming a second electrode structure on an outer surface of the dielectric layer.

4. The method of manufacturing the semiconductor structure according to claim 3, wherein the forming a first electrode layer on an inner wall of the capacitor hole comprises:
   forming a first initial electrode layer on the inner wall of the capacitor hole, wherein the first initial electrode layer extends out of the capacitor hole and covers a top surface of the stacked structure and the top surface of the isolation structure in the first region, and the first initial electrode layer further covers a top surface of the stacked structure in the second region;
   removing, in a same etching step, part of the first initial electrode layer between adjacent capacitor holes, and the first initial electrode layer located on the top surface of the stacked structure in the first region; and removing the first initial electrode layer located on the top surface of the isolation structure, wherein the remaining part of the first initial electrode layer forms the first electrode layer.

5. The method of manufacturing the semiconductor structure according to claim 4, wherein the removing part of the first initial electrode layer between adjacent capacitor holes, and the first initial electrode layer located on the top surface of the stacked structure in the first region comprises:
forming, on the first initial electrode layer, a first dielectric layer and a dielectric anti-reflective coating layer that are stacked;
patterning the dielectric anti-reflective coating layer, to form a first opening on the dielectric anti-reflective coating layer, wherein the first opening is corresponding to the stacked structure between the adjacent capacitor holes; and
removing, through etching by using the patterned dielectric anti-reflective coating layer as a mask, part of the first dielectric layer, and part of the first initial electrode layer in the first region and the second region, and removing, through etching, part of the third support layer in the first region and the second region, to expose part of a top surface of the second sacrificial layer.

6. The method of manufacturing the semiconductor structure according to claim 5, wherein the removing the first initial electrode layer located on the top surface of the isolation structure comprises:
removing the second sacrificial layer;
removing the remaining part of the first dielectric layer;
removing the first initial electrode layer covering the top surface of the third support layer and covering the top surface of the isolation structure;
removing the second support layer in the first region and part of the second support layer located in the second region; and
removing the first sacrificial layer,
wherein a remaining part of the first initial electrode layer forms the first electrode layer.

7. The method of manufacturing the semiconductor structure according to claim 6, wherein the forming a dielectric layer on an inner wall of the first recess comprises:
forming an initial dielectric layer on the inner wall of the first recess, wherein the initial dielectric layer extends out of the first recess and covers the first support layer in the first region and the top surface and the sidewall of the isolation structure.

8. The method of manufacturing the semiconductor structure according to claim 7, wherein the forming a second electrode structure on an outer surface of the dielectric layer comprises:
forming a second initial electrode layer on the outer surface of the initial dielectric layer, wherein the second initial electrode layer in the second region forms a second recess;
forming an initial buffer layer in the second recess, wherein the initial buffer layer fills up the second recess, and covers the second initial electrode layer located in the first region; and
removing part of the initial dielectric layer, part of the second initial electrode layer, and part of the initial buffer layer that are located in the first region, wherein a remaining part of the second initial electrode layer and a remaining part of the initial buffer layer form the second electrode structure.

9. The method of manufacturing the semiconductor structure according to claim 8, wherein the method of manufacturing the semiconductor structure further comprises:
forming a second dielectric layer on the first support layer of the first region, wherein the second dielectric layer extends to the second region and covers the second electrode structure;
forming spaced contact openings in the first region, wherein the contact opening exposes the top surface of the contact structure; and
forming a contact plug in the contact opening.

10. A semiconductor structure, comprising:
a base, wherein spaced contact structures are provided on a surface of the base;
a support structure, wherein the support structure is provided on the base, and the support structure comprises a plurality of spaced support layers;
an isolation structure, wherein the isolation structure is provided along a direction perpendicular to the base, and is connected to the base through part a remaining of the support layer, to divide the base into a first region and a second region; and
capacitor structures, wherein the capacitor structures are arranged at intervals in the support structure of the second region, and are correspondingly connected to the contact structures in the second region;
wherein a material of the isolation structure is silicon nitride.

11. The semiconductor structure according to claim 10, wherein the capacitor structure comprises:
a first electrode layer, located in the support structure and connected to the contact structure;
a dielectric layer, covering the first electrode layer and an exposed surface of the support structure, extending to the first region, and covering a top surface and a sidewall of the isolation structure; and
a second electrode structure, covering the dielectric layer.

12. The semiconductor structure according to claim 11, wherein
the support structure comprises a first support layer, a second support layer, and a third support layer that are sequentially spaced from bottom to top;
the first support layer is located on an upper surface of the base and is connected to part of a sidewall of the first electrode layer;
the second support layer and the third support layer are provided in parallel to the first support layer and are connected to part of the sidewall of the first electrode layer; and
a bottom of the isolation structure is connected to the base through the first support layer.

13. The semiconductor structure according to claim 11, wherein
the second electrode structure comprises a second electrode layer and a buffer layer;
the second electrode layer covers the dielectric layer; and
the buffer layer covers the second electrode layer.

14. The semiconductor structure according to claim 10, wherein the capacitor structure has an extension portion along a direction toward the first region, where the extension portion extends into the first region and covers a top surface and a sidewall of the isolation structure.

* * * * *